United States Patent

Chang et al.

[11] Patent Number: 5,311,137
[45] Date of Patent: May 10, 1994

[54] LIQUID CRYSTAL ELECTRIC FIELD TESTER FOR CIRCUIT BOARDS

[75] Inventors: David B. Chang, Tustin; Slava A. Pollack, Palos Verdes Estate; James Drummond, Oceanside; Michael F. Berg, Indio Hills, all of Calif.

[73] Assignee: Hughes Aircraft Company, Los Angeles, Calif.

[21] Appl. No.: 8,230

[22] Filed: Jan. 21, 1993

Related U.S. Application Data

[63] Continuation of Ser. No. 833,564, Feb. 7, 1992, abandoned, which is a continuation of Ser. No. 427,395, Oct. 27, 1989, abandoned.

[51] Int. Cl.$^5$ .................. G01R 31/00; G01R 31/302; G02F 1/13
[52] U.S. Cl. .................. 324/501; 324/530; 324/537; 324/96; 324/158 R; 359/74; 359/84
[58] Field of Search ........ 324/500, 501, 537, 96, 324/158 R, 530; 359/36, 43, 62, 63, 64, 74, 84, 87, 99, 103

[56] References Cited

U.S. PATENT DOCUMENTS

| | | | |
|---|---|---|---|
| 3,934,199 | 1/1976 | Channin | 324/158 R |
| 4,242,635 | 12/1980 | Burns | 324/158 R |
| 4,355,278 | 10/1982 | Burns et al. | 324/501 X |
| 4,506,550 | 3/1985 | Sandhu | 73/603 |
| 4,527,864 | 7/1985 | Dir | 350/349 X |
| 4,710,700 | 12/1987 | Osaki et al. | 324/632 X |
| 4,783,150 | 11/1988 | Tabony | 350/351 |
| 4,818,072 | 4/1989 | Mohebban | 350/334 X |
| 5,157,528 | 10/1992 | Clark et al. | 359/43 X |
| 5,175,504 | 12/1992 | Henley | 324/501 |
| 5,184,237 | 2/1993 | Iimura et al. | 359/63 |

OTHER PUBLICATIONS

Gladstone et al., Liquid Crystal Display Devices, vol. 14, No. 5 IBM Tech. Disc. Bull., Oct. 1971, pp. 1472-1473.

Primary Examiner—Kenneth A. Wieder
Assistant Examiner—Glenn W. Brown
Attorney, Agent, or Firm—Wanda K. Denson-Low

[57] ABSTRACT

A nondestructive noninvasive device and method for testing printed circuit boards (PCBs) through the utilization of a liquid crystal material which visually images the electric fields of the PCBs. Circuit faults resulting in a change of current flow in a PCB produce recognizable changes in observed electric fields. The present invention may be used in a stand-alone mode or as a supplement to other testing techniques.

16 Claims, 1 Drawing Sheet

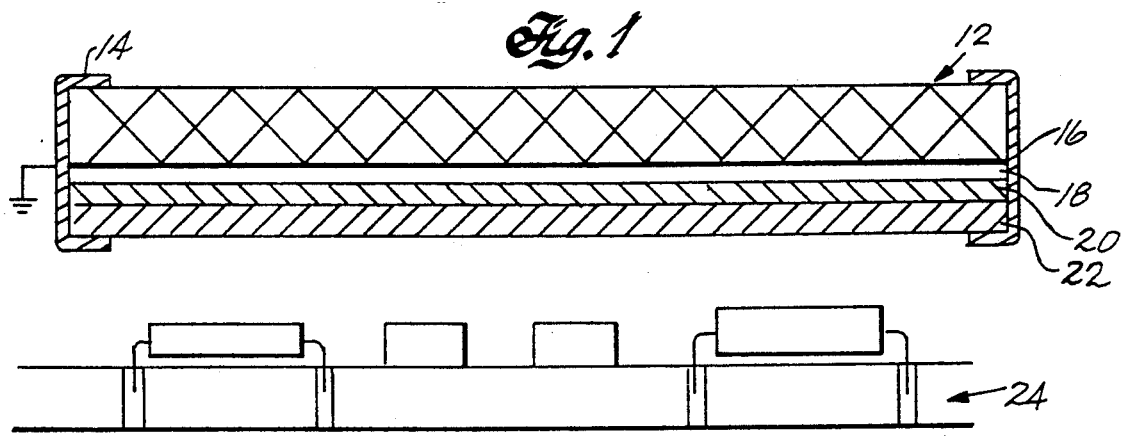
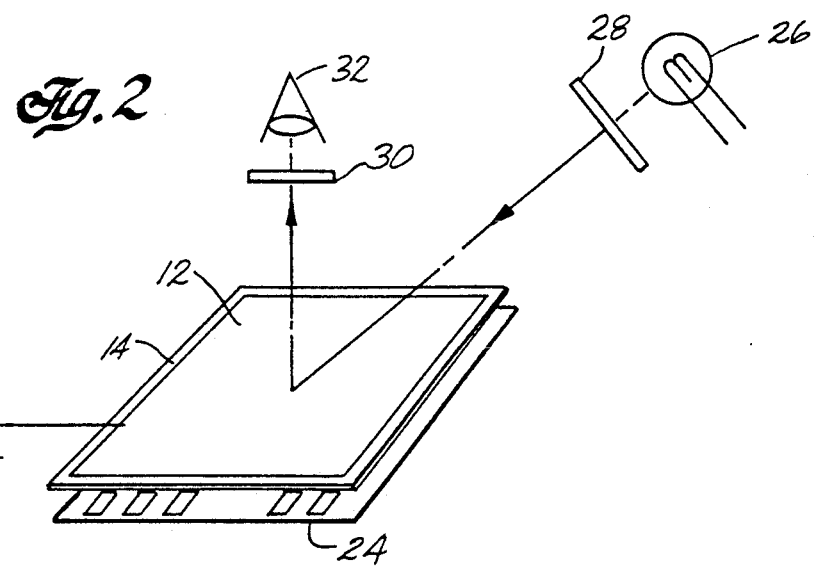
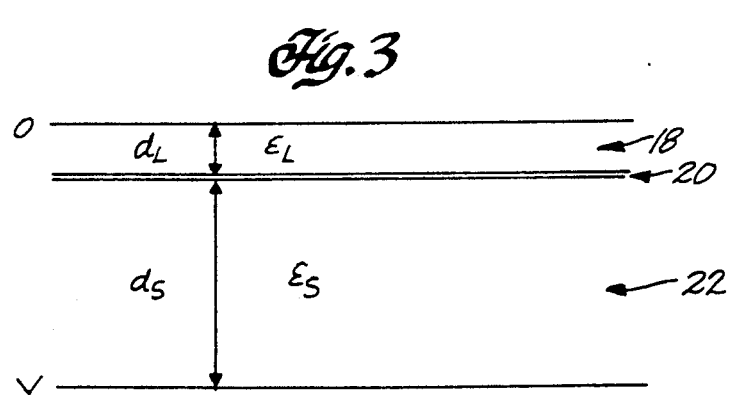

LIQUID CRYSTAL ELECTRIC FIELD TESTER FOR CIRCUIT BOARDS

This is a continuation of application Ser. No. 833,564, filed Feb. 7, 1992, now abandoned, which is a continuation of application Ser. No. 427,395, filed Oct. 27, 1989, now abandoned.

BACKGROUND OF THE INVENTION

1. Field of the Invention

The present invention relates generally to the field of testing electronic devices and more particularly, to a system and method for fault detection of printed circuit boards (PCB's) by imaging their electric field distribution.

2. Description of Prior Art

The testing and repairing of PCBs has become an increasingly complex task. To test and repair circuits, fault isolation measurements must often be made at interior points on a PCB, inaccessible from the PCB's edge connectors or other standard circuit connection points. Direct contact (bed of nails) testers have classically been used to test these internal points, however, such testers impose large localized stresses on boards adversely affecting their lifetime. Additionally, customized nail beds are required for each size and shape of PCB tested. In the case of PCBs with protective layers of plastic, the coating must be destroyed before direct contact testing can be carried out.

As the circuit density and number of printed circuit layers of PCBs increase, the efficiency and practical use of direct contact testers for fault isolation diminishes.

Various methods are known for noninvasive nondestructive technique for PCB testing. One method involves scanning the PCB with an infrared camera. By this method thermal images of working circuit boards may be generated and faults resulting in changes to power distribution are clearly visible. A problem with this method is that any failure which does not result in a change in component temperature cannot be seen. Open signal lines and digital circuit gate failures generally do not change the power dissipation and thus are not detectable by this method.

Another method of noninvasive nondestructive testing, limited to the testing of individual components, utilizes liquid crystals. A single integrated chip is coated with a surfactant solution. A drop of liquid crystal material is placed on the chip. A thin glass cover plate is treated with surfactant solution and lowered onto the drop. Operation of the integrated circuit in the chip causes electric field induced birefringence in the liquid crystal. As a result, a refractive index pattern is produced in the liquid crystal which mirrors the pattern of the electric fields and temperatures at the surface of the integrated circuit. This testing method is described in D. J. Channin, "Liquid-Crystal Technique for Observing Integrated Circuit Operation," *IEEE Transactions on Electron Devices*, vol. ED-21, pp. 650–652, October 1974, which is incorporated herein.

An apparatus and method is needed for testing an entire PCB which has the benefits of the visualization of component operation provided by the use of liquid crystals and the speed of operation provided by direct contact testers.

SUMMARY OF THE INVENTION

The present invention provides a nondestructive noninvasive device and method for determining circuit faults by visualizing the electric fields created by a PCB.

The presently preferred embodiment of the invention is a device containing liquid crystal material. This embodiment may be used in either a stand-alone tester or in combination with other testing devices.

Electric fields are produced by PCB's through the operation of their circuits. The strength of these electric fields are related directly to the voltages present within the operating circuits. Typical potentials are several volts while typical distances between conductors vary from a few millimeters on a PCB to 1 micron within an integrated circuit component. These fields of one to several thousand v/cm decrease by the square or higher power of the observational distance. Liquid crystal material contained within a structure having high permeability to electrical fields, placed near an operating PCB, provides a visual display signature of the electric field distribution of the PCB. Circuit faults resulting in changes of current flow in the PCB produce recognizable changes in the electric field signature of the PCB.

Optical properties of liquid crystal material are altered by the presence of the electrical field created by the PCB. This results in a 2-dimensional visual image ("signature") of the electrical field. The signatures produced by normally operating PCBs are recorded as "standards" for later comparison with PBCs undergoing tests. Unexpected changes in a PCB's signature reflect atypical circuit operation. The observed signatures are used as an aid to fault isolation.

A presently preferred embodiment of the current invention comprises a transparent cover plate having an inner and outer surface; a nematic liquid crystal film interfacing with the inner surface of the cover plate; a sheet of high dielectric material having an inner and outer surface, the inner surface interfacing with the liquid crystal film, opposite the cover plate, the dielectric material being of such thickness and having such permeability that it is transparent to electric fields created by the operation of electronic devices; means for holding the cover plate, sheet of dielectric material and the liquid crystal film in stacked relation to each other; means for illuminating the fault detection device with linear polarized light; and means for observing the linear polarized light reflected from the fault detection device through a cross polarized filter.

By observing the polarized light reflected from the liquid crystal film through a cross polarized filter, the operation of the electronic device may be observed as bright images on the liquid crystal film. The observed images are compared to formerly observed images of a reference electronic device. Any differences between the two images may be used as a guide in isolating faults in the operation of the electronic device being tested.

In another embodiment a guest-host liquid crystal material is used which changes color in response to the presence of electric fields. The use of this type of liquid crystal material eliminates the need to use polarized light and a cross filter to observe the operation of the invention.

In another embodiment a surfactant is placed on the inner surfaces of the cover plate and the sheet of dielectric material to promote alignment of the liquid crystal molecules.

In another embodiment a mirror is coated on the inner surface of the dielectric material to provide an improved reflection surface. When a mirror is thus used surfactant may be placed on the inner surface of the mirror. In another embodiment a transparent conducting layer is placed between the liquid crystal material and the inner surface of the cover plate. Charging the conducting layer creates an equipotential surface above the liquid crystal layer with respect to the PCB being tested. This enhances the liquid crystal's sensitivity to the electric fields of the PCB.

The foregoing and other advantageous and distinguishing features of the invention are described in detail below and are recited in the appended claims.

BRIEF DESCRIPTION OF THE DRAWINGS

FIG. 1 is a cross-section elevation view of a presently preferred embodiment of the invention;

FIG. 2 is a pictorial representation of the operation of the embodiment of FIG. 1.

FIG. 3 is a schematic representation of several elements which determine the operational efficiency of the embodiment of FIG. 1.

DETAILED DESCRIPTION OF THE PREFERRED EMBODIMENTS

The presently preferred embodiment of the invention utilizes the effect of electric fields on nematic liquid crystals to provide a visual image of the electric field distribution over the surface of a PCB. Liquid crystals are materials with optical properties sensitive to applied electric fields. Nematic liquid crystals rotate the polarization of incident light when they are in the crystallized state with no electric field applied. In the presence of a PCB's electric field liquid crystal material responds by molecular rotation to the component of the electric field that is perpendicular to the PCB surface. An image of this molecular response is then formed by passing a beam of linear polarized light through the liquid crystal material and reflecting this light from a mirror or from the interface of the second surface of the liquid crystal layer and its constraining structure. The reflected beam of light is observed through a cross polarizing filter.

Where the presence of electric fields have caused a molecular rotation of portions of the liquid crystal material, a polarized rotation of light also occurs at those locations. This permits light from those locations to pass through the cross polarizing filter used by an observer. The locations appear as bright images on the surface of the liquid crystal material. Light passing through the undistorted portions of the liquid crystal material is blocked by the cross polarizer and these regions appear dark. A pattern of light and dark images are produced in the field of view of the cross polarizer which mirrors the pattern of the electric field of the PCB.

Fields which are steady or pulsed will produce various images in the liquid crystal material. Fields that are steadily present will appear as the brightest areas. Fields that are turned on and off at a rate exceeding the liquid crystal response time will produce a nonzero average response. This average will cause a bright area whose intensity varies with the repetition rate of the field when it is below a saturation rate dependant upon the response time of the liquid crystal material.

As a result of the liquid crystal's response to the presence of the PCB's electric field, a visual display signature is produced for the operating parts of the PCB.

The carrier structure needed to house the liquid crystal material must have a special property. The electrical fields sought to be visualized must be able to penetrate the structure and reach the liquid crystal material without significant attenuation of field strength. A thin high permittivity dielectric layer is utilized in the structure for this purpose.

FIG.1 shows a cross-section elevation view of a presently preferred embodiment of the invention. It comprises a sandwich structure whose elements are in a stacked relationship to one another. The device includes a top transparent cover plate 12, an optional transparent conducting layer 16, a liquid crystal material layer 18, an optional dielectric mirror 20, a high permittivity dielectric bottom layer 22 and a frame 14.

The frame 14 engages the marginal portions of the outer surfaces of the stacked elements and provides support for the structure.

The bottom layer 22 provides additional support for the structure and consists of a high permittivity dielectric layer such as a membrane of Barium titanate or polyvinylidine fluoride with a thickness of approximately 0.5 mm. The thickness of layer 22 is critical to the operability of this embodiment and is discussed more fully below. Its structural rigidity may be provided or enhanced by tension applied by the frame 14.

The optional dielectric mirror 20 is coated on the upper surface of the dielectric layer to a thickness of approximately 25 microns. The preferred thickness is that necessary to reflect a majority of the light striking its upper surface. The mirror coating may be applied by the chemical vapor deposition technique widely used in the semiconductor industry.

In the absence of the mirror, the polarized beam of light is reflected by the change of the refractive index between the liquid crystal layer 18 and the dielectric layer 22. The use of the mirror increases the contrast of the image produced.

The liquid crystal layer 18 is a film with a preferred thickness of 10 microns. An electrical field providing the equivalent of an applied potential of 3-10 volts applied across the liquid crystal layer is required to initiate the optical effects, with thicker liquid crystal layers having lower thresholds. The effects saturate at several times the critical voltage. Between these extremes the brightness indicates qualitatively the magnitude of the electrical fields. A liquid crystal with negative dielectric anisotropy is used such as undoped n-(p-methoxybenzylidene)-pbutylaniline. The liquid crystal is confined by the transparent cover plate 12 to an optically homogeneous layer.

A surfactant solution such as lecithin in trichloroethylene may be coated on the layers interfacing with the liquid crystal to promote molecular alignment perpendicular to the surface of the liquid crystal material. This may enhance the sensitivity of the liquid crystal utilized.

The optional transparent conducting layer 16 is coated on the bottom surface of the glass layer 12 to a thickness of a few hundred angstroms. A layer in excess of 1000 angstroms may reduce the light transmissivity of the layer by an unacceptable amount. A layer less than 100 angstroms may be too resistive.

The thickness and material of the transparent cover plate 12 is not critical to the operation of the invention. A glass plate is the presently preferred material and a thickness of 0.5 cm is sufficient to provide some additional rigidity to the sandwich structure.

A necessary feature of this invention is the use of a high permittivity dielectric for the bottom layer 22. This makes it possible for the PCB voltages to create the high electric fields ($\sim >10^3$ volts/cm) in the liquid crystal layer required to change the liquid crystal's optical properties.

The use of a high permittivity dielectric prevents the voltage on a PCB from being dropped across the dielectric layer rather than across the liquid crystal layer.

The volts/cm resulting from various thickness of layer 22 may be calculated as follows: Referring to FIG. 3., the voltage appearing at the interface between the liquid crystal layer 18 and the dielectric layer 22 is:

$$V_I = \frac{(\epsilon_S/d_S)V}{(\epsilon_L/d_L) + (\epsilon_S/d_S)} \quad \text{EQ. 1}$$

Where: $\epsilon_S$ = Permittivity of dielectric layer 22 plus optional mirrored coating 20.
$d_S$ = Thickness of layers 20 and 22.
V = volts
$\epsilon_L$ = Permittivity of liquid crystal layer 18.
$d_L$ = Thickness of layer 18.
giving a field across the liquid crystal layer of magnitude $$E = \frac{\epsilon_S V}{\epsilon_L d_S + \epsilon_S d_L} \quad \text{EQ. 2}$$

Thus, it is desirable to have $$\epsilon_L d_S << \epsilon_S d_L \quad \text{EQ. 3}$$

As a numerical example, if $\epsilon_L = 4$, $\epsilon_S = 10^4$, $d_S = 0.5$mm, $d_L = 10$ microns, and V = 1 volt $$E = \frac{10^4 \times 1}{4 \times 5 \times 10^{-2} + 10^4 \times 10^{-3}} \approx 920 \text{ volt/cm} \quad \text{EQ. 4 volt/cm}$$

This is the magnitude of field required for reorienting the liquid crystal molecules. Materials such as Barium titanate or polyvinylidine fluoride can be used as dielectrics of the right permittivity at the specified thicknesses.

If the optional transparent conducting layer 16 is used, the device is electrically grounded by grounding the conducting layer 16. This creates an equipotential surface above the liquid crystal layer 18 with respect to the PCB being tested enhancing the liquid crystal's sensitivity to the electric fields of the PCB.

As shown in FIG. 2, the device is placed adjacent to an operating PCB 24, shown with components mounted thereon, and illuminated by a bulb 26 causing a beam of light to pass through a polarizing filter 28. The top surface of the device is viewed by an observer 32 through a cross polarizing filter 30. An image is formed as light passes through the liquid crystal layer and is reflected from the interface of the liquid crystal layer 18 and the dielectric layer 22 or if dielectric mirror 20 is employed, from the upper surface of the mirror.

In another embodiment of the invention a guesthost liquid crystal material is used in place of the nematic liquid crystal material, described above. A "guest" dye is mixed with a "host" liquid crystal material. When the resulting liquid crystal material's molecular orientation is changed in the presence of an electric field, there is a corresponding change in the color of the guest dye. This effect of electric fields on guest-host liquid crystal material is well known. If an operating PCB is the source of the electric field, a colored visual display signature is produced for the operating parts of the PCB. This may be observed by viewing the device in ambient light. As with nematic liquid crystal material, both steady and pulsed electric fields will cause an optical response by the guesthost liquid crystal material.

This embodiment utilizes the same structure as that of the presently preferred embodiment described above, with the exception that the liquid crystal material 18 is of a guest-host type, such as lyotropic liquid crystal rather than nematic, and the polarizing filters 28 and 30 as shown in FIG. 2 are not utilized. The viewing light source 26 may be incandescent, fluorescent or other commonly utilized lighting.

Having now described the invention in accordance with the requirements of the patent statutes, those skilled in this art will have no difficulties making changes and modifications in the disclosed embodiments of the individual elements of the invention in order to meet specific requirements or conditions. Such changes and modifications may be made without departing from the scope and spirit of the invention as set forth in the following claims.

What is claimed is:

1. A device for detecting faults in a printed circuit board, comprising;
    a transparent cover plate;
    a liquid crystal film for attenuating incident light in a pattern indicative of the faults during operation of the printed circuit board;
    a sheet of high permittivity dielectric material underlying the liquid crystal film for separating the liquid crystal film from the circuit board, the high permittivity dielectric material being of such thickness and having such permittivity that it permits the electric fields created by the operation of the printed circuit board to reach the liquid crystal film without signficant attenuation of field strength; and
    means for holding the transparent cover plate, sheet of high permittivity dielectric material and the liquid crystal film in stacked relation to each other.

2. The fault detecting device of claim 1 further comprising a first substantially uniform surfactant coating between the transparent cover plate and the liquid crystal film.

3. The fault detecting device of claim 2 further comprising a second substantially uniform surfactant coating between the sheet of high permittivity dielectric material and the liquid crystal film.

4. The fault detecting device of claim 1 wherein said high permittivity dielectric material is selected from the group consisting of barium titanate and polyvinylidine fluoride.

5. The fault detecting device of claim 1 further comprising a mirror between the liquid crystal film and the high permittivity dielectric material.

6. The fault detecting device of claim 5 wherein the mirror comprises a reflective coating.

7. The fault detecting device of claim 1 further comprising a transparent conducting layer between the transparent cover plate and the liquid crystal film.

8. The fault detecting device of claim 1 wherein the holding means comprises a frame which sealingly engages a marginal portion of the cover plate and the sheet of high permittivity dielectric material.

9. A device for detecting faults in an electronic circuit by visually indicating changes in the electric fields generated during operation of said circuit comprising;
   a transparent cover plate;
   a host liquid crystal film and a guest dye mixed with said host liquid crystal film. said dye for changing color in response to changes in said electric fields during operation to provide an unaided color visual indication of the presence of a fault in said circuit;
   a sheet of high permittivity dielectric material underlying the liquid crystal film, the high permittivity dielectric material being of such thickness and having such permittivity that it permits the electric fields created by the operation of the electronic circuit to reach the liquid crystal material without significant attenuation of field strength; and
   means for holding the cover plate, sheet of high permittivity dielectric material and the liquid crystal film in stacked relation to each other.

10. The fault detecting device of claim 9 wherein said high permittivity dielectric material is selected from the group consisting of barium titanate and polyvinylidine fluoride.

11. The fault detecting device of claim 9 further comprising a surfactant coating between the transparent cover plate and the liquid crystal film.

12. The fault detecting device of claim 11 further comprising a surfactant coating between the high permittivity dielectric material and the liquid crystal film.

13. The fault detecting device of claim 9 further comprising a mirror between the liquid crystal film and the high permittivity dielectric material.

14. The fault detecting device of claim 13 wherein the mirror comprises a reflective coating.

15. The fault detecting device of claim 9 further comprising a transparent conducting layer between the transparent cover plate and the liquid crystal film.

16. The fault detecting device of claim 9 wherein the holding means comprises a frame which sealingly engages the cover plate and the sheet of high permittivity dielectric material.

* * * * *